(12) United States Patent
Ishibashi

(10) Patent No.: US 8,853,670 B2
(45) Date of Patent: *Oct. 7, 2014

(54) III NITRIDE SEMICONDUCTOR SUBSTRATE, EPITAXIAL SUBSTRATE, AND SEMICONDUCTOR DEVICE

(75) Inventor: Keiji Ishibashi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/281,894

(22) Filed: Oct. 26, 2011

(65) Prior Publication Data

US 2012/0068155 A1    Mar. 22, 2012

Related U.S. Application Data

(63) Continuation of application No. PCT/JP2010/051145, filed on Jan. 28, 2010.

(30) Foreign Application Priority Data

Sep. 30, 2009 (JP) ................ P2009-228605

(51) Int. Cl.
| | | |
|---|---|---|
| H01L 29/06 | (2006.01) | |
| H01L 21/02 | (2006.01) | |
| C23C 16/30 | (2006.01) | |
| C30B 25/18 | (2006.01) | |
| C30B 29/40 | (2006.01) | |
| H01L 33/12 | (2010.01) | |
| H01L 33/00 | (2010.01) | |
| H01L 33/32 | (2010.01) | |

(52) U.S. Cl.
CPC .......... *H01L 21/02658* (2013.01); *H01L 33/00* (2013.01); *C23C 16/303* (2013.01); *C30B 25/186* (2013.01); *C30B 29/403* (2013.01); *H01L 21/02389* (2013.01); *H01L 21/02433* (2013.01); *H01L 21/02439* (2013.01); *H01L 21/0254* (2013.01); *H01L 33/12* (2013.01); *H01L 33/32* (2013.01)

USPC ............... 257/13; 257/12; 257/14; 257/183; 257/E29.022; 438/22; 438/60

(58) Field of Classification Search
CPC ... H01L 21/02389; H01L 33/32; H01L 33/00; H01L 21/0262; H01L 21/0239; H01L 21/02658; H01L 33/12; H01L 21/02433
USPC .......... 257/12, 13, 14, 183, E29.022; 438/60, 438/22

See application file for complete search history.

(56) References Cited

U.S. PATENT DOCUMENTS

| | | |
|---|---|---|
| 5,508,522 A | 4/1996 | Nakanishi et al. |
| 6,488,767 B1 | 12/2002 | Xu et al. |

(Continued)

FOREIGN PATENT DOCUMENTS

| | | | | |
|---|---|---|---|---|
| EP | 1 739 760 | * | 1/2007 | .............. H01L 33/00 |
| JP | 2001-077476 | | 3/2001 | |

(Continued)

OTHER PUBLICATIONS

Office Action dated Jun. 5, 2014 issued in U.S. Appl. No. 13/347,717 including double patenting rejections on pp. 2-4.

*Primary Examiner* — Thinh T Nguyen

(74) *Attorney, Agent, or Firm* — Drinker Biddle & Reath LLP

(57) ABSTRACT

In a semiconductor device 100, it is possible to prevent C from piling up at a boundary face between an epitaxial layer 22 and a group III nitride semiconductor substrate 10 by the presence of $30 \times 10^{10}$ pieces/cm² to $2000 \times 10^{10}$ pieces/cm² of sulfide in terms of S and 2 at % to 20 at % of oxide in terms of O in a surface layer 12 with a front surface 10a having a specific plane orientation. Accordingly, a high-resistivity layer is prevented from being formed at the boundary face between the epitaxial layer 22 and the group III nitride semiconductor substrate 10. Consequently, it is possible to improve the emission intensity of the semiconductor device 100.

15 Claims, 11 Drawing Sheets

(56) References Cited

U.S. PATENT DOCUMENTS

| | | | |
|---|---|---|---|
| 6,518,602 B1 | 2/2003 | Yuasa et al. | |
| 6,596,079 B1 | 7/2003 | Vaudo et al. | |
| 7,154,131 B2 | 12/2006 | Irikura et al. | |
| 7,416,604 B2 | 8/2008 | Ishibashi et al. | |
| 7,622,791 B2 | 11/2009 | Shibata | |
| 7,687,382 B2 * | 3/2010 | Nakamura | 438/503 |
| 7,854,804 B2 | 12/2010 | Ishibashi et al. | |
| 7,901,960 B2 * | 3/2011 | Ishibashi et al. | 438/22 |
| 8,044,493 B2 | 10/2011 | Nishiura | |
| 2001/0023022 A1 | 9/2001 | Nishiura et al. | |
| 2002/0011599 A1 * | 1/2002 | Motoki et al. | 257/76 |
| 2002/0185054 A1 | 12/2002 | Xu et al. | |
| 2005/0009310 A1 * | 1/2005 | Vaudo et al. | 438/543 |
| 2005/0059229 A1 | 3/2005 | Minemoto et al. | |
| 2005/0257733 A1 * | 11/2005 | Nakahata | 117/1 |
| 2007/0018284 A1 | 1/2007 | Nakayama et al. | |
| 2008/0213543 A1 * | 9/2008 | Leibiger et al. | 428/172 |
| 2008/0272392 A1 | 11/2008 | Ishibashi et al. | |
| 2008/0308906 A1 | 12/2008 | Osada et al. | |
| 2010/0187540 A1 | 7/2010 | Ishibashi et al. | |
| 2012/0104558 A1 * | 5/2012 | Ishibashi | 257/615 |

FOREIGN PATENT DOCUMENTS

| | | |
|---|---|---|
| JP | 3183335 | 4/2001 |
| JP | 2001-223191 | 8/2001 |
| JP | 2005-112641 | 4/2005 |
| JP | 2005-213075 | 8/2005 |
| JP | 2005-298319 | 10/2005 |
| JP | 2006-005331 A | 1/2006 |
| JP | 2007-005526 | 1/2007 |
| JP | 2008-300422 | 12/2008 |
| JP | 2009-132618 A | 6/2009 |
| JP | 4333820 | 7/2009 |
| JP | 2009-200523 | 9/2009 |
| WO | WO-2005/041283 | 5/2005 |
| WO | 2008/047627 | 4/2008 |
| WO | WO 2008/107010 | 9/2008 |

* cited by examiner

Fig.7
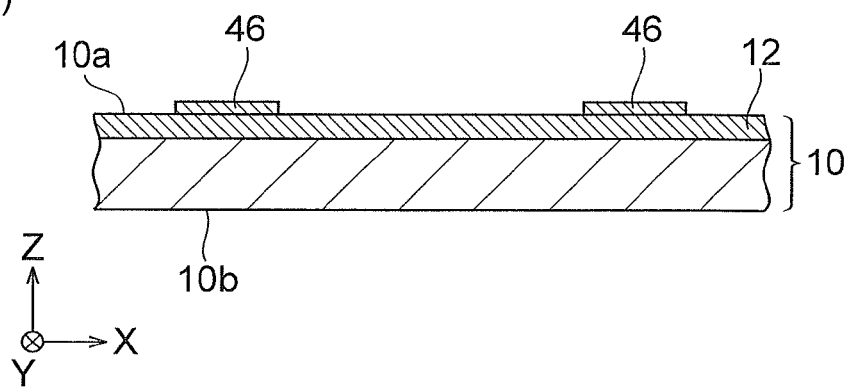
(a)
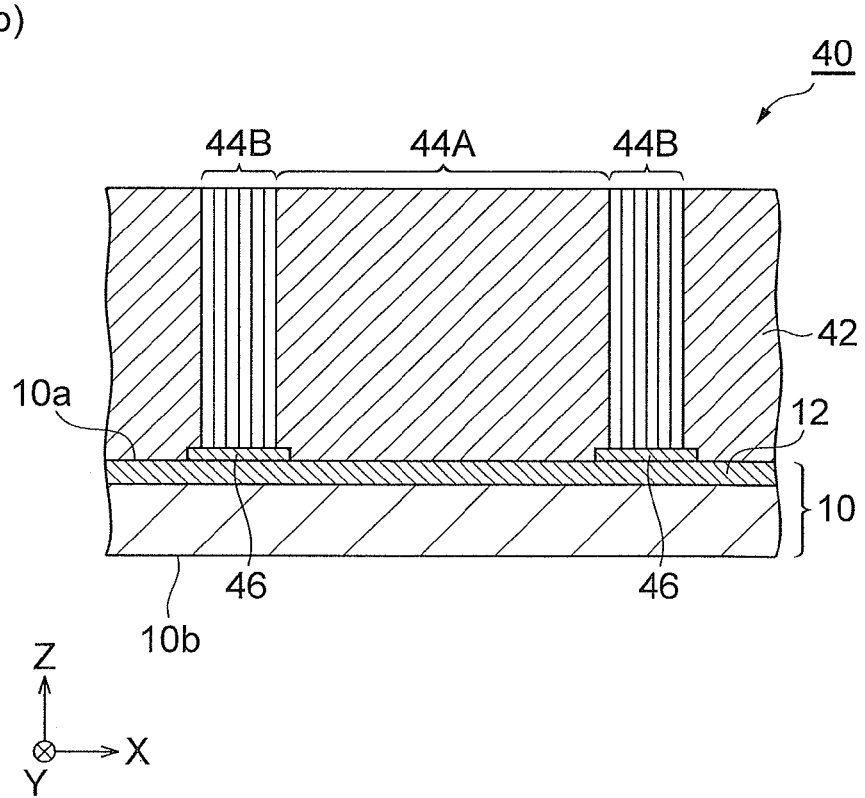
(b)

*Fig.8*
(a)
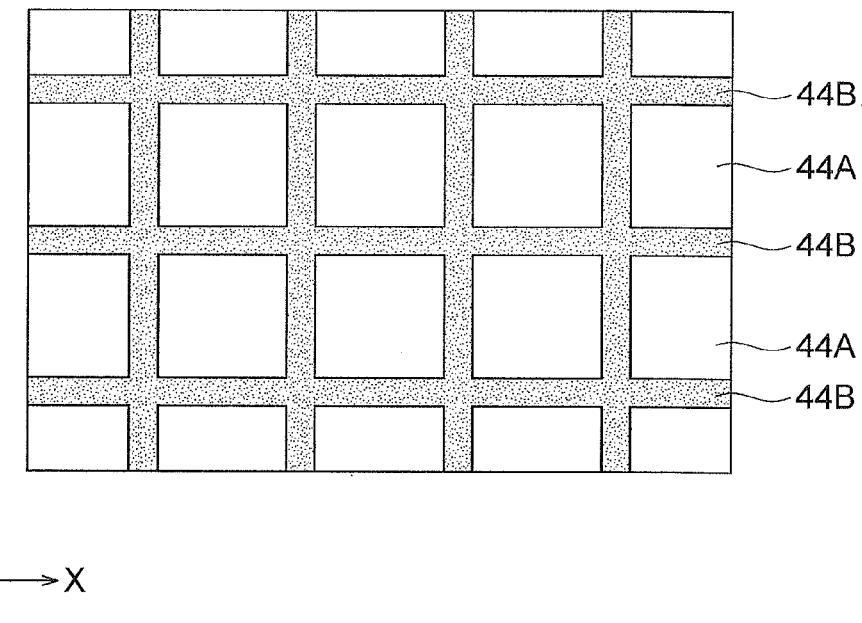
(b)
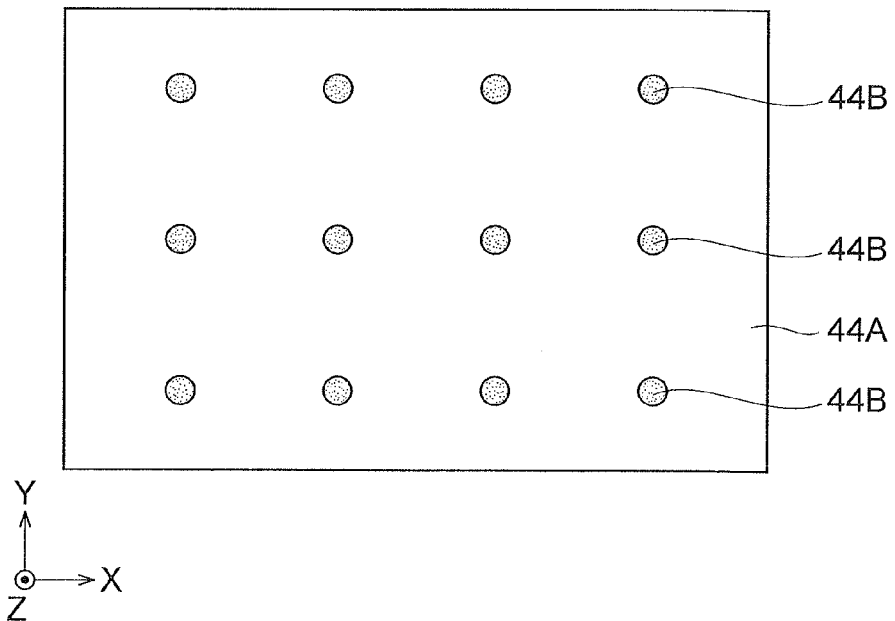

III NITRIDE SEMICONDUCTOR SUBSTRATE, EPITAXIAL SUBSTRATE, AND SEMICONDUCTOR DEVICE

CROSS-REFERENCE TO RELATED APPLICATIONS

This is a continuation application PCT application No. PCT/JP2010/051145 filed on Jan. 28, 2010, claiming the benefit of priority from Japanese Patent application 2009-228605 filed on Sep. 30, 2009, and incorporated by reference in its entirety.

TECHNICAL FIELD

The present invention relates to a group III nitride semiconductor substrate, an epitaxial substrate and a semiconductor device.

BACKGROUND ART

In recent years, semiconductors, including compound semiconductors, have been used in an increasingly wider range of application fields by taking advantage of various characteristic features of the semiconductors. For example, a compound semiconductor is useful as a base substrate for epitaxial layers to be laminated on, thus, the compound semiconductor is used in semiconductor devices such as a light-emitting diode (LED) and a laser diode (LD).

If a semiconductor substrate is used as the base substrate, a surface of the semiconductor substrate needs to be processed into a strain-free mirror surface. Accordingly, preprocessing (for example, cutting, lapping and etching) is performed on a single-crystal semiconductor ingot to obtain a semiconductor substrate, and then mirror-polishing is performed on a surface of the semiconductor substrate.

As semiconductor substrates, there are known, for example, those described in Patent Literatures 1 to 3 below. Patent Literature 1 discloses a semiconductor substrate obtained by cutting a crystalline III-V nitride (for example, (Al, Ga, In)—N) crystal-grown by means of vapor-phase epitaxy (VPE) and then performing preprocessing. Patent Literature 1 discloses performing chemical polishing (CMP) after mechanically polishing a surface of the semiconductor substrate, as a preprocessing, in order to remove superficial damage caused by the mechanical polishing.

Patent Literature 2 discloses a semiconductor substrate in which a surface of an $Al_xGa_yIn_zN$ ($0<y\leq 1$, $x+y+z=1$) wafer is polished by CMP to reduce RMS-based surface roughness to less than 0.15 nm, thereby reducing surface defect and contamination. Patent Literature 2 discloses using $Al_2O_3$ or $SiO_2$ as abrasive grains at the time of performing CMP and adjusting pH by adding an oxidizing agent to a polishing liquid.

Patent Literature 3 discloses a semiconductor substrate in which an Si concentration at a boundary face between an epitaxial layer and the semiconductor substrate is set to $8\times 10^{17}$ $cm^{-3}$ or lower, on the assumption that Si piled up (accumulated) on the boundary face between the epitaxial layer and the semiconductor substrate deteriorates device characteristics.

CITATION LIST

Patent Literature

Patent Literature 1: Specification of U.S. Pat. No. 6,596,079
Patent Literature 2: Specification of U.S. Pat. No. 6,488,767
Patent Literature 3: Patent Publication No. 3183335

SUMMARY OF INVENTION

Technical Problem

However, a semiconductor device using a laminated body formed by disposing an epitaxial layer (well layer) on a semiconductor substrate described in Patent Literatures 1 to 3 cited above has limitations in improving emission intensity. Accordingly, there has been a strong desire for the development of a semiconductor substrate capable of improving the emission intensity of a semiconductor device.

The present invention has been accomplished in order to solve the above-described problem, an object of the present invention is to provide a group III nitride semiconductor substrate capable of improving the emission intensity of a semiconductor device, an epitaxial substrate, and a semiconductor device.

Solution to Problem

The present inventors have found, as a result of extensive research, that if an impurity, such as C (carbon), is present on a surface of a semiconductor substrate, the C piles up on a boundary face when the epitaxial layer is formed on the surface of the semiconductor substrate, and therefore, a layer high in electrical resistance (hereinafter referred to as "high-resistivity layer") is formed on the epitaxial layer/semiconductor substrate boundary face. The present inventors have also found that the electrical resistance of the epitaxial layer/semiconductor substrate boundary face increases as the result of the high-resistivity layer being formed, and therefore, emission intensity decreases.

In addition, the present inventors have found that by the presence of specific amounts of sulfide and oxide on a substrate surface with the substrate surface having a specific plane orientation in a group III nitride semiconductor substrate used for a semiconductor device, it is possible to prevent C from piling up on a boundary face between an epitaxial layer and the semiconductor substrate. By thus preventing C from piling up, a high-resistivity layer is prevented from being formed on the boundary face between the epitaxial layer and the semiconductor substrate. Accordingly, it is possible to reduce electrical resistance at the boundary face between the epitaxial layer and the semiconductor substrate, and improve the crystal quality of the epitaxial layer. Consequently, it is possible to improve the emission intensity of the semiconductor device.

The present invention is a group III nitride semiconductor substrate used in a semiconductor device, comprising a surface layer on a front surface of the group III nitride semiconductor substrate, the surface layer contains $30\times 10^{10}$ pieces/$cm^2$ to $2000\times 10^{10}$ pieces/$cm^2$ of sulfide in terms of S and 2 at % to 20 at % of oxide in terms of O, and the inclination angle of a normal axis of the front surface with respect to a c-axis is 10° to 81°.

In addition, the surface layer preferably contains $40\times 10^{10}$ pieces/$cm^2$ to $1500\times 10^{10}$ pieces/$cm^2$ of sulfide in terms of S. In this case, it is possible to further prevent the formation of a high-resistivity layer at the boundary face between the epitaxial layer and the semiconductor substrate, thereby further improving the emission intensity of the semiconductor device.

In addition, the surface layer preferably contains 3 at % to 16 at % of oxide in terms of O. In this case, it is possible to further prevent the formation of a high-resistivity layer at the boundary face between the epitaxial layer and the semiconductor substrate, thereby further improving the emission intensity of the semiconductor device.

Furthermore, the present inventors have found that by the presence of a specific amount of chloride or a specific amount of silicon compound on a substrate surface, it is possible to further prevent the formation of a high-resistivity layer at the boundary face between the epitaxial layer and the semiconductor substrate, thereby further improving the emission intensity of the semiconductor device.

The surface layer preferably contains $120 \times 10^{10}$ pieces/cm$^2$ to $15000 \times 10^{10}$ pieces/cm$^2$ of chloride in terms of Cl. In addition, the surface layer preferably contains $100 \times 10^{10}$ pieces/cm$^2$ to $12000 \times 10^{10}$ pieces/cm$^2$ of silicon compound in terms of Si.

Furthermore, the present inventors have found that by controlling the content of carbon compound in the substrate surface to a specific amount or less, it is possible to further prevent the formation of a high-resistivity layer at the boundary face between the epitaxial layer and the semiconductor substrate, thereby further improving the emission intensity of the semiconductor device.

The content of carbon compound in the surface layer is preferably 22 at % or less in terms of C.

In addition, the present inventors have found that a copper compound in the substrate surface contributes to the formation of a high-resistivity layer. Furthermore, by controlling the content of copper compound in the substrate surface to a specific amount or less, it is possible to further prevent the formation of a high-resistivity layer at the boundary face between the epitaxial layer and the semiconductor substrate, thereby further improving the emission intensity of the semiconductor device.

The content of copper compound in the surface layer is preferably $150 \times 10^{10}$ pieces/cm$^2$ or lower in terms of Cu.

In addition, the surface roughness of the surface layer is preferably 5 nm or less on an RMS basis. In this case, it is possible to further improve the crystal quality of the epitaxial layer, thereby further improving the emission intensity of the semiconductor device.

In addition, the dislocation density of the surface layer is preferably $1 \times 10^6$ pieces/cm$^2$ or lower. In this case, it is possible to further improve the crystal quality of the epitaxial layer, thereby further improving the emission intensity of the semiconductor device.

In addition, the plane orientation of the front surface is preferably one of a {20-21} plane, a {20-2-1} plane, a {10-11} plane, a {10-1-1} plane, a {11-22} plane, a {11-2-2} plane, a {22-43} plane, a {22-4-3} plane, a {11-21} plane, and a {11-2-1} plane. In this case, it is possible to reduce the half-value width of light emission.

An epitaxial substrate according to the present invention comprises the above-described group III nitride semiconductor substrate and an epitaxial layer formed on the surface layer of the group III nitride semiconductor substrate, wherein the epitaxial layer contains a group III nitride semiconductor.

Since the epitaxial substrate according to the present invention comprises the above-described group III nitride semiconductor substrate, it is possible to prevent C from piling up at a boundary face between the epitaxial layer and the semiconductor substrate. Accordingly, it is possible to prevent the formation of a high-resistivity layer at the boundary face between the epitaxial layer and the semiconductor substrate, thereby improving the emission intensity of the semiconductor device.

In addition, the epitaxial substrate is preferably such that the epitaxial layer comprises an active layer having a quantum well structure and the active layer is provided so as to emit light of 430 nm to 550 nm in wavelength.

A semiconductor device according to the present invention comprises the above-described epitaxial substrate.

Since the semiconductor device according to the present invention comprises the above-described epitaxial substrate, it is possible to prevent C from piling up at a boundary face between the epitaxial layer and the semiconductor substrate. Accordingly, it is possible to prevent the formation of a high-resistivity layer at the boundary face between the epitaxial layer and the semiconductor substrate, thereby improving the emission intensity of the semiconductor device.

Advantageous Effects of Invention

According to the present invention, there is provided a group III nitride semiconductor substrate capable of improving the emission intensity of a semiconductor device, an epitaxial substrate, and a semiconductor device.

BRIEF DESCRIPTION OF DRAWINGS

FIG. 7 is a drawing illustrating a procedure for fabricating an epitaxial substrate according to a third embodiment.

FIG. 8 is a plan view illustrating a modified example of an epitaxial substrate according to a third embodiment.

DESCRIPTION OF EMBODIMENTS

Hereinafter, preferred embodiments of a group III nitride semiconductor substrate, an epitaxial substrate and a semiconductor device according to the present invention will be described in detail while referring to the accompanying drawings.

(Group III Nitride Semiconductor Substrate)

Figure 1:
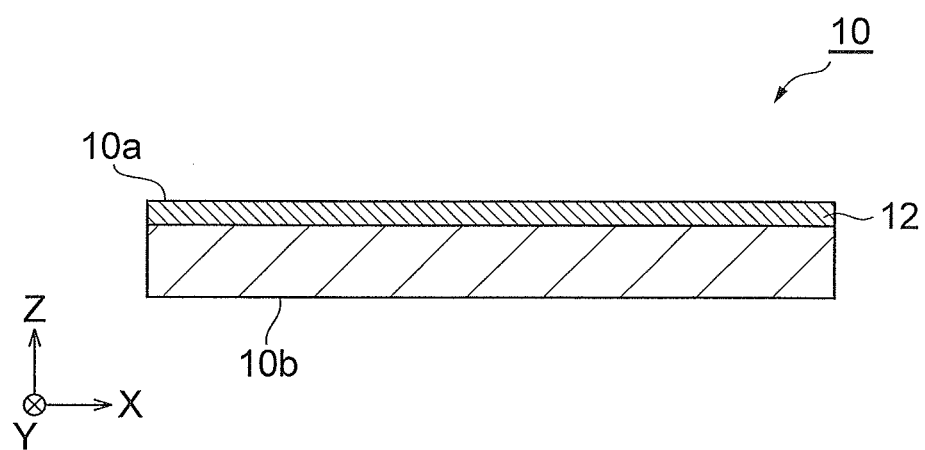
FIG. 1 is a schematic cross-sectional view illustrating a group III nitride semiconductor substrate according to a first embodiment.

FIG. 1 is a schematic cross-sectional view illustrating a group III nitride semiconductor substrate 10 according to a first embodiment. As illustrated in FIG. 1, the group III nitride semiconductor substrate 10 (hereinafter referred to as "nitride substrate 10") comprises a front surface 10a and a rear surface 10b opposed to each other, and a surface layer 12 is formed on the front surface 10a.

The constituent material of the nitride substrate 10 is preferably a crystal having a wurtzite structure, examples of the constituent material include GaN, AlN, InN, AlGaN and InGaN. A nitride substrate 10 made of GaN can be fabricated by, for example, an HYPE method or a flux method. A nitride substrate 10 made of AlN can be fabricated by, for example, an HYPE method or a sublimation method. A nitride substrate 10 made of InN, AlGaN or InGaN can be fabricated by, for example, an HVPE method.

The nitride substrate 10 allows for the epitaxial growth of a desired semiconductor layer (epitaxial layer) on the front surface 10a. The quality of the front surface 10a is preferably suited for the formation of an epitaxial layer. Unlike the crystal quality of a bulk portion within the substrate, the quality of the front surface 10a is susceptible to effects caused by a surface composition, surface roughness, and an affected layer.

Here, the affected layer refers to a layer with crystal lattice disorder, formed in the front surface-side region of a crystal due to the grinding or polishing thereof. The presence and the thickness of the affected layer can be confirmed by making an SEM, TEM or CL (cathode luminescence) observation on a cross section of a crystal broken at the cleavage surface thereof. The thickness of the affected layer is preferably 20 nm or smaller, and more preferably 10 nm or smaller. If the affected layer is too thick, the morphology and crystallinity of the epitaxial layer tend to degrade.

The CL observation refers to observing visible light or light close in wavelength to a visible wavelength range emitted from the group III nitride semiconductor crystal by making electron beams incident on a group III nitride semiconductor crystal as exciting light. In the CL observation of the group III nitride semiconductor crystal, light is observed in a crystalline region excellent in surface condition, light is not observed in a region of an affected layer having crystal disorder, and the region is observed as a black linear shade.

When the nitride substrate 10 is used in a semiconductor device, it is preferable to prevent a high-resistivity layer from being formed at a boundary face between the nitride substrate 10 and the epitaxial layer. If the electrical resistance of the boundary face increases due to the presence of the high-resistivity layer, the luminous efficiency of the semiconductor device degrades. In particular, the luminous efficiency degrades remarkably if a large electric current is injected into the semiconductor device.

From the viewpoint of preventing the formation of such a high-resistivity layer, the surface layer 12 contains a sulfide and an oxide.

The surface layer 12 contains $30 \times 10^{10}$ pieces/cm$^2$ to $2000 \times 10^{10}$ pieces/cm$^2$ of sulfide in terms of S and 2 at % to 20 at % of oxide in terms of O. The content of sulfide is preferably $40 \times 10^{10}$ pieces/cm$^2$ to $1500 \times 10^{10}$ pieces/cm$^2$, and more preferably $100 \times 10^{10}$ pieces/cm$^2$ to $500 \times 10^{10}$ pieces/cm$^2$, in terms of S. The content of oxide is preferably 3 at % to 16 at %, and more preferably 4 at % to 12 at %, in terms of O. If the content of sulfide is less than $30 \times 10^{10}$ pieces/cm$^2$ or the content of oxide is less than 2 at %, a high-resistivity layer is formed at the boundary face between the semiconductor substrate and the epitaxial layer, and therefore, the emission intensity of the semiconductor device degrades due to a resistance increase in the boundary face. If the content of sulfide exceeds $2000 \times 10^{10}$ pieces/cm$^2$ or the content of oxide exceeds 20 at %, the crystal quality of the epitaxial layer degrades, and therefore, the emission intensity of the semiconductor device degrades.

The surface layer 12 preferably contains $120 \times 10^{10}$ pieces/cm$^2$ to $15000 \times 10^{10}$ pieces/cm$^2$ of chloride in terms of Cl. The content of chloride is more preferably $350 \times 10^{10}$ pieces/cm$^2$ to $10000 \times 10^{10}$ pieces/cm$^2$, and even more preferably $1000 \times 10^{10}$ pieces/cm$^2$ to $5000 \times 10^{10}$ pieces/cm$^2$, in terms of Cl. If the content of chloride is less than $120 \times 10^{10}$ pieces/cm$^2$, a high-resistivity layer is liable to form at the boundary face between the semiconductor substrate and the epitaxial layer, and therefore, the emission intensity of the semiconductor device tends to degrade due to a resistance increase in the boundary face. If the content of chloride exceeds $15000 \times 10^{10}$ pieces/cm$^2$, the crystal quality of the epitaxial layer is liable to degrade, and therefore, the emission intensity of the semiconductor device tends to degrade.

The surface layer 12 preferably contains $100 \times 10^{10}$ pieces/cm$^2$ to $12000 \times 10^{10}$ pieces/cm$^2$ of silicon compound in terms of Si. The content of silicon compound is more preferably $200 \times 10^{10}$ pieces/cm$^2$ to $12000 \times 10^{10}$ pieces/cm$^2$, even more preferably $500 \times 10^{10}$ pieces/cm$^2$ to $8000 \times 10^{10}$ pieces/cm$^2$, and extremely preferably $1000 \times 10^{10}$ pieces/cm$^2$ to $5000 \times 10^{10}$ pieces/cm$^2$, in terms of Si. If the content of silicon compound is less than $100 \times 10^{10}$ pieces/cm$^2$, a high-resistivity layer is liable to form at the boundary face between the semiconductor substrate and the epitaxial layer, and therefore, the emission intensity of the semiconductor device tends to degrade due to a resistance increase in the boundary face. If the content of silicon compound exceeds $12000 \times 10^{10}$ pieces/cm$^2$, the crystal quality of the epitaxial layer is liable to degrade, and therefore, the emission intensity of the semiconductor device tends to degrade.

The surface layer 12 may contain a carbon compound. The content of carbon compound in the surface layer 12 is preferably 22 at % or less, more preferably 18 at % or less, and even more preferably 15 at % or less, in terms of C. If the content of carbon compound exceeds 22 at %, the crystal quality of the epitaxial layer is liable to degrade, and therefore, the emission intensity of the semiconductor device tends to degrade, while a high-resistivity layer is liable to form at the boundary face between the semiconductor substrate and the epitaxial layer, and therefore, the emission intensity of the semiconductor device tends to degrade due to a resistance increase in the boundary face.

The surface layer 12 may contain a copper compound. The content of copper compound in the surface layer 12 is preferably $150 \times 10^{10}$ pieces/cm$^2$ or less, more preferably $100 \times 10^{10}$ pieces/cm$^2$ or less, and even more preferably $50 \times 10^{10}$ pieces/cm$^2$ or less, in terms of Cu. If the content of copper compound exceeds $150 \times 10^{10}$ pieces/cm$^2$, the crystal quality of the epitaxial layer is liable to degrade, and the emission intensity of the semiconductor device tends to degrade, while a high-resistivity layer is liable to form at the boundary face between the semiconductor substrate and the epitaxial layer, and therefore, the emission intensity of the semiconductor device tends to degrade due to a resistance increase in the boundary face.

The composition of the surface layer 12 can be quantified for S, Si, Cl and Cu by means of TXRF (total reflection X-ray fluorescence analysis). On the basis of an X-ray penetration depth, TXRF evaluates a composition ranging from a surface to a depth of approximately 5 nm. For O and C, the quantities thereof can be determined by means of AES (Auger electron spectroscopy analysis). AES has a resolution of 0.1%. On the basis of the escape depth of Auger electrons, AES evaluates a composition ranging from a surface to a depth of approximately 5 nm. Note that the surface layer 12 is a layer having a thickness of, for example, approximately 5 nm which allows ingredients contained in the surface layer to be measured by TXRF or AES.

A difference in composition between the surface layer 12 and a bulk portion within the nitride substrate 10 can be evaluated by conducting analysis in a depth direction using SIMS (secondary ion mass spectroscopy). Differences in composition among the interior of the nitride substrate 10, the boundary face between the nitride substrate 10 and the epitaxial layer, and the interior of the epitaxial layer can also be evaluated by SIMS.

The surface roughness of the surface layer 12 in the nitride substrate 10 is preferably 5 nm or less, more preferably 3 nm or less, and even more preferably 1 nm or less, on an RMS basis, from the viewpoint of being able to further improve the crystal quality of the epitaxial layer and the integral intensity of light emission by an element. In addition, from the viewpoint of making excellent productivity and excellent crystal quality of the epitaxial layer compatible with each other, the surface roughness is preferably 1 nm to 3 nm. Here, RMS-based surface roughness (root-mean-square roughness) can be measured using an AFM (atomic force microscope) with a 10 μm-square region of the front surface 10a defined as a reference area.

The dislocation density of the surface layer 12 is preferably $1 \times 10^6$ pieces/cm$^2$ or less, more preferably $1 \times 10^5$ pieces/cm$^2$ or less, and even more preferably $1 \times 10^4$ pieces/cm$^2$ or less. If the dislocation density exceeds $1 \times 10^6$ pieces/cm$^2$, the crystal quality of the epitaxial layer is liable to degrade, and therefore, the emission intensity of the semiconductor device tends to degrade. On the other hand, from the viewpoint of excellent cost-effectiveness and productivity at the time of fabricating a crystal, the dislocation density is preferably $1 \times 10^2$ pieces/cm$^2$ or higher. The dislocation density can be calculated by making a CL observation and counting the number of nonluminescent dots within a 10 μm-square region of the surface layer 12.

The front surface 10a of the nitride substrate 10 is a semipolar face, and the plane orientation of the front surface 10a is preferably one of a {20-21} plane, a {20-2-1} plane, a {10-11} plane, a {10-1-1} plane, a {11-22} plane, a {11-2-2} plane, a {22-43} plane, a {22-4-3} plane, a {11-21} plane and a {11-2-1} plane of a wurtzite structure. In this case, it is also possible to improve the indium (In)-capturing efficiency of the epitaxial layer, and therefore, obtain an excellent light-emitting property. The plane orientation of the front surface 10a can be measured using, for example, an X-ray diffractometer (XRD).

The inclination angle (off angle) of the normal axis of the front surface 10a with respect to the c-axis thereof is 10° to 81°, preferably 17° to 80°, and more preferably 63° to 79°. With the inclination angle being 10° or larger, a piezoelectric field caused by the spontaneous polarization of a wurtzite structure is suppressed, and therefore, it is possible to improve the PL intensity of a light-emitting device. With the inclination angle being 81° or smaller, it is possible to reduce the dislocation density of the epitaxial layer (well layer), thereby improving the emission intensity of the semiconductor device.

Next, a method for manufacturing the nitride substrate 10 will be described.

First, a group III nitride semiconductor crystal is grown in a c-axis or m-axis direction by an HYPE method or the like, and then peripheral machining is performed on the crystal to shape the crystal, to obtain an ingot of a group III nitride semiconductor. Next, the ingot thus obtained is cut at a desired angle by using a wire saw or a blade saw, to obtain the nitride substrate 10 with the front surface 10a having a desired off angle. Note that a semipolar substrate may be used as a base substrate to grow a group III nitride semiconductor crystal on the semipolar substrate, and the ingot thus obtained with a surface having a desired off angle may be used instead.

Next, machining processes, such as a grinding process (grinding) and a lapping process, are performed, in order to planarize a substrate surface. For the grinding, it is possible to use a grinding stone containing diamond, SiC, BN, Al$_2$O$_3$, Cr$_2$O$_3$, ZrO$_2$, or the like as hard abrasive grains. For the lapping process, it is possible to use a commonly-known abrading agent containing diamond, SiC, BN, Al$_2$O$_3$, Cr$_2$O$_3$, ZrO$_2$, or the like as hard abrasive grains.

The abrasive grains are selected as appropriate, by taking into consideration the mechanical actions and properties thereof. For example, abrasive grains having a high degree of hardness and a large grain diameter are used from the viewpoint of raising a polishing rate.

Alternatively, abrasive grains having a low degree of hardness and a small grain diameter are used from the viewpoint of smoothing a surface and preventing the formation of an affected layer. In addition, multistep grinding in which a change is made from abrasive grains having a large grain size to abrasive grains having a small grain size along with the progress of polishing processing is preferred from the viewpoint of shortening a polishing time and obtaining a smooth surface.

After grinding and lapping processes are performed on the nitride substrate 10, in order to reduce the surface roughness of the front surface 10a of the nitride substrate 10 and remove an affected layer, surface finish, such as dry etching and CMP, is performed on the front surface 10a. Note that dry etching may be performed before grinding and lapping processes.

Figure 2:
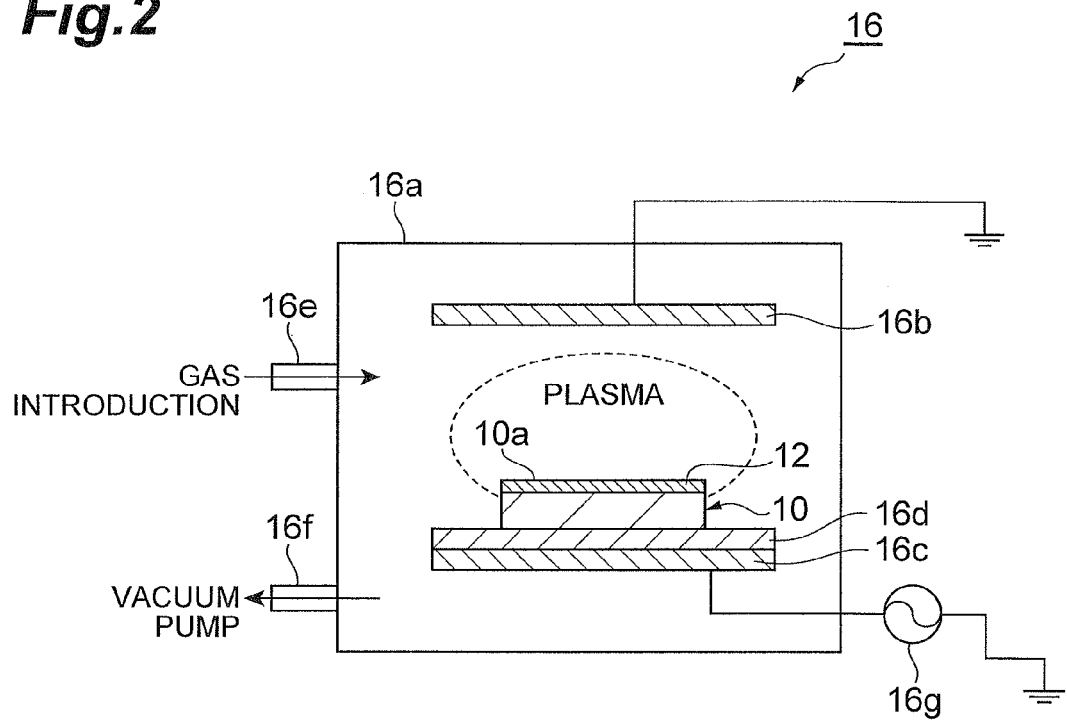
FIG. 2 is a drawing illustrating an apparatus usable in dry etching.

Examples of dry etching include RIE (reactive ion etching), inductively-coupled plasma RIE (ICP-RIE), ECR (electron cyclotron resonance)-RIE, CAIBE (chemically-assisted ion-beam etching), and RIBE (reactive ion-beam etching), of the examples, reactive ion etching is preferred. For reactive ion etching, it is possible to use, for example, a dry etching apparatus 16 illustrated in FIG. 2.

The dry etching apparatus 16 comprises a chamber 16a. Parallel plate type upper and lower electrodes 16b and 16c and a substrate support base 16d disposed on the lower electrode 16c so as to be opposite to the upper electrode 16b are provided inside the chamber 16a. A gas supply port 16e connected to a gas source and a gas exhaust port 16f connected to a vacuum pump are provided inside the chamber 16a. A high-frequency power source 16g connected to the lower electrode 16c is disposed outside the chamber 16a.

In the dry etching apparatus 16, plasma can be generated inside the chamber 16a by supplying a gas from the gas supply port 16e into the chamber 16a, and supplying high-frequency power from the high-frequency power source 16g to the lower electrode 16c. By placing the nitride substrate 10 on the substrate support base 16d, the front surface 10a of the nitride substrate 10 can be dry-etched.

By using a sulfuric gas as an etching gas supplied from the gas supply port 16e, it is possible to obtain a high etching rate and adjust the sulfide content of the surface layer 12. As the sulfuric gas, it is possible to use, for example, H$_2$S, SO$_2$, SF$_4$ or SF$_6$. Likewise, by using a chloric gas as the etching gas, it is possible to obtain a high etching rate and adjust the chloride content of the surface layer 12. As the chloric gas, it is possible to use, for example, Cl$_2$, HCl, CCl$_4$, BCl$_3$, SiCl$_4$ or SiHCl$_3$. The silicon compound and carbon compound contents of the surface layer 12 can be adjusted by using, for example, SiCl$_4$, SiHCl$_3$, CH$_4$ or C$_2$H$_2$ as the etching gas. Note that by adjusting a gas type, a gas flow rate, pressure inside a chamber, and etching power, it is also possible to control the content of ingredients contained in the surface layer 12.

In reactive ion etching, it is preferable to satisfy Expression (1) shown below, where P(Pa) is pressure inside a chamber, Q (sccm) is a gas flow rate, and V(L) is a chamber volume.

$$0.05 \leq PV/Q \leq 3.0 \tag{1}$$

If PV/Q is smaller than 0.05, surface roughness tends to increase. If PV/Q is larger than 3.0, a surface reforming effect tends to reduce.

Figure 3:
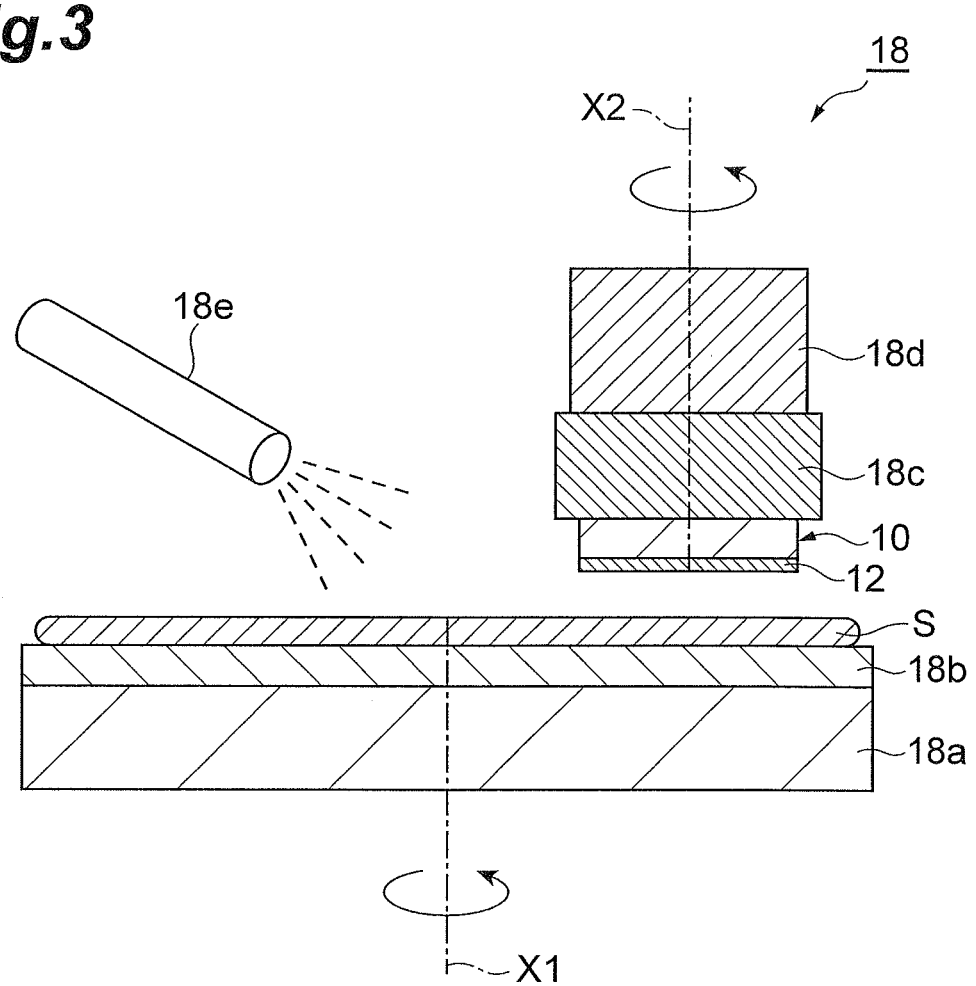
FIG. 3 is a drawing illustrating an apparatus usable in polishing.

For CMP, it is possible to use, for example, a polishing apparatus 18 illustrated in FIG. 3. The polishing apparatus 18 comprises a surface plate 18a, a polishing pad 18b, a crystal holder 18c, a weight 18d, and a slurry liquid supply port 18e.

The polishing pad 18b is mounted on the surface plate 18a. The surface plate 18a and the polishing pad 18b can rotate around the central axis line X1 of the surface plate 18a. The crystal holder 18c is a part used to support the nitride substrate 10 onto a lower surface of the crystal holder. Load is applied to the nitride substrate 10 by the weight 18d mounted on an upper surface of the crystal holder 18c. The crystal holder 18c has a central axis line X2 substantially parallel with the axis line X1 in a position displaced from the axis line X1, the crystal holder 18c can rotate around this central axis line X2. The slurry liquid supply port 18e supplies slurry S for a CMP solution onto the polishing pad 18b.

According to this polishing apparatus 18, CMP can be performed on the front surface 10a by rotating the surface plate 18a, the polishing pad 18b and the crystal holder 18c, supplying the slurry S onto the polishing pad 18b, and bringing the front surface 10a of the nitride substrate 10 into contact with the polishing pad 18b.

The contents of ingredients contained in the surface layer 12 can be adjusted by the additive, pH and oxidation-reduction potential of the CMP solution. Abrasive grains can be added to the CMP solution. As the material of the abrasive grains, it is possible to use at least one type of metal oxide selected from the group consisting of $ZrO_2$, $SiO_2$, $CeO_2$, $MnO_2$, $Fe_2O_3$, $Fe_3O_4$, NiO, ZnO, CoO, $Co_3O_4$, $GeO_2$, CuO, $Ga_2O_3$ and $In_2O_3$. It is also possible to use Si, Cu, a Cu—Zn alloy, a Cu—Sn alloy, or a compound such as $Si_3N_4$ or SiAlON. The material of the abrasive grains is preferably a material having a high degree of ionization tendency from the viewpoint of enhancing detergency, if the material is higher in the degree of ionization tendency than H, it is possible to particularly improve removal efficiency based on cleaning. Note that a CMP solution not containing abrasive grains may be used instead. By using Si, $Si_3N_4$, SiAlON or the like as the abrasive grains, it is possible to adjust the silicon compound content of the surface layer 12. By using Cu, a Cu—Zn alloy, a Cu—Sn alloy or the like, it is possible to adjust the copper compound content of the surface layer 12.

From the viewpoint of fully preventing abrasive grains from remaining on the front surface 10a after CMP, a surfactant may be added to the CMP solution. Examples of the surfactant include a carboxylic acid type surfactant, a sulfonic acid type surfactant, a sulfuric acid ester type surfactant, a quaternary ammonium salt type surfactant, an alkylamine salt type surfactant, an ester type surfactant, and an ether type surfactant.

A nonpolar solvent is preferable as a solvent of the CMP solution. Examples of the nonpolar solvent include carbon hydride, carbon tetrachloride, and diethyl ether. By using a nonpolar solvent, it is possible to facilitate solid contact between an abrasive grain which is a metal oxide and a substrate, and therefore, it is possible to efficiently control the metal composition of a substrate surface.

The chemical action (mechanochemical effect) of the CMP solution on the semiconductor substrate can be adjusted by the pH and oxidation-reduction potential of the CMP solution. The pH of the CMP solution is preferably 1 to 6 or 8.5 to 14, and more preferably 1.5 to 4 or 10 to 13. As a pH adjuster, it is possible to use salt such as hydrosulfate, carbonate or phosphate, in addition to inorganic acid such as hydrochloric acid, nitric acid, sulfuric acid or phosphoric acid; organic acid such as formic acid, acetic acid, citric acid, malic acid, tartaric acid, succinic acid, phthalic acid, maleic acid or fumaric acid; or alkali such as KOH, NaOH, $NH_4OH$, organic alkali or amine. By using organic acid as the pH adjuster, it is possible to improve an impurity removal effect, when compared at the same pH with inorganic acid and inorganic salt. Dicarboxylic acid (divalent carboxylic acid) is preferable as the organic acid.

By using sulfur atom-containing acid such as sulfuric acid, hydrosulfate such as sodium sulfate, or thiosulfate such as sodium thiosulfate, as the pH adjuster and an oxidizing agent, it is possible to adjust the sulfide content of the surface layer 12. By using chlorine atom-containing acid such as hydrochloric acid; salt such as potassium chloride; hypochlorite such as hypochlorous acid, sodium hypochlorite or calcium hypochlorite; chlorinated isocyanuric acid such as trichloroisocyanuric acid; or chlorinated isocyanurate such as sodium dichloroisocyanurate, it is possible to adjust the chloride content of the surface layer 12. By using organic acid, organic acid salt or the like such as carbonic acid, carbonate, citric acid, oxalic acid, fumaric acid, phthalic acid or malic acid, it is possible to adjust the carbon compound content of the surface layer 12.

The oxidation-reduction potential of the CMP solution can be adjusted using an oxidizing agent. By adding the oxidizing agent to the CMP solution to increase the oxidation-reduction potential, it is possible to improve a polishing rate, while maintaining the removal effect of abrasive grains high, and adjust the oxide content of the surface layer 12. The oxidizing agent is not limited in particular, a chlorine-based oxidizing agent including hypochlorite such as hypochlorous acid, sodium hypochlorite or calcium hypochlorite, chlorinated isocyanuric acid such as trichloroisocyanuric acid, or chlorinated isocyanurate such as sodium dichloroisocyanurate; a sulfur-based oxidizing agent including sulfuric acid and thiosulfate such as sodium thiosulfate; permanganate such as potassium permanganate; dichromate such as potassium dichromate; bromate salt such as potassium bromate; thiosulfate such as sodium thiosulfate; persulfate such as ammonium persulfate or potassium persulfate; nitric acid; hydrogen peroxide solution; or ozone is preferably used from the viewpoint of fully raising the oxidation-reduction potential. By using a sulfur-based oxidizing agent or a chlorine-based oxidizing agent, among these examples, it is possible to improve the polishing rate and adjust the post-polishing sulfide and chloride contents of the surface layer 12 to the above-described preferable contents.

Here, the relationship between x and y preferably satisfies Expression (2) shown below, where x is the pH value of a CMP solution and y (mV) is the value of an oxidation-reduction potential.

$$-50x+1400 \le y \le -50x+1900 \qquad (2)$$

If y exceeds the upper limit of Expression (2), corrosive action on the polishing pad and the polishing apparatus becomes stronger, and therefore, polishing in a stable manner tends to be difficult to perform and the oxidation of a substrate surface tends to progress to an excessive degree. If y is smaller than the lower limit of Expression (2), oxidizing action on the substrate surface is liable to weaken, and therefore, the polishing rate tends to decrease.

By controlling the viscosity of the CMP solution, it is possible to adjust the contents of ingredients contained in the surface layer 12. The viscosity of the CMP solution is preferably 2 mPa·s to 30 mPa·s, and more preferably 5 mPa·s to 10 mPa·s. If the viscosity of the CMP solution is lower than 2 mPa·s, the contents of ingredients contained in the surface layer 12 tend to be higher than the above-described desired values, if the viscosity exceeds 30 mPa·s, the contents of ingredients contained in the surface layer 12 tend to be lower than the above-described desired values. Note that the viscosity of the CMP solution can be adjusted by adding a high-viscosity organic compound such as ethylene glycol or an inorganic compound such as boehmite to the solution.

The sulfide content of the surface layer 12 can be adjusted by the concentration of sulfuric acid ions in the CMP solution or by a contact coefficient C. The contact coefficient C is defined by "$C=\eta \times V/P$" by using the viscosity $\eta$ (mPa·s) of the CMP solution, a circumferential velocity V(m/s) at the time of polishing, and pressure P (kPa) at the time of polishing. The contact coefficient C is preferably $1.0 \times 10^{-6}$ m to $2.0 \times 10^{-6}$ m. If the contact coefficient C is smaller than $1.0 \times 10^{-6}$ m, load on the semiconductor substrate in CMP is liable to be strong, and therefore, the sulfide content of the surface layer 12 tends to be an excess quantity, if the contact coefficient C exceeds $2.0 \times 10^{-6}$ m, the polishing rate tends to decrease and the sulfide content of the surface layer 12 tends to become lower.

Pressure at the time of polishing is preferably 3 kPa to 80 kPa, and more preferably 10 kPa to 60 kPa. If the pressure is lower than 3 kPa, the polishing rate tends to be practically insufficient, if the pressure exceeds 80 kPa, the surface quality of a substrate tends to degrade.

According to the nitride substrate 10, it is possible to prevent C from piling up at a boundary face between an epitaxial layer and the nitride substrate 10 by the presence of $30 \times 10^{10}$ pieces/cm$^2$ to $2000 \times 10^{10}$ pieces/cm$^2$ of sulfide in terms of S and 2 at % to 20 at % of oxide in terms of O in the surface layer 12 with the front surface 10a having the above-described specific plane orientation. By thus preventing C from piling up, a high-resistivity layer is prevented from being formed at the boundary face between the epitaxial layer and the nitride substrate 10. Accordingly, it is possible to reduce electrical resistance at the boundary face between the epitaxial layer and the nitride substrate 10, and improve the crystal quality of the epitaxial layer. Consequently, it is possible to improve the emission intensity of a semiconductor device.

(Epitaxial Substrate)

Figure 4:
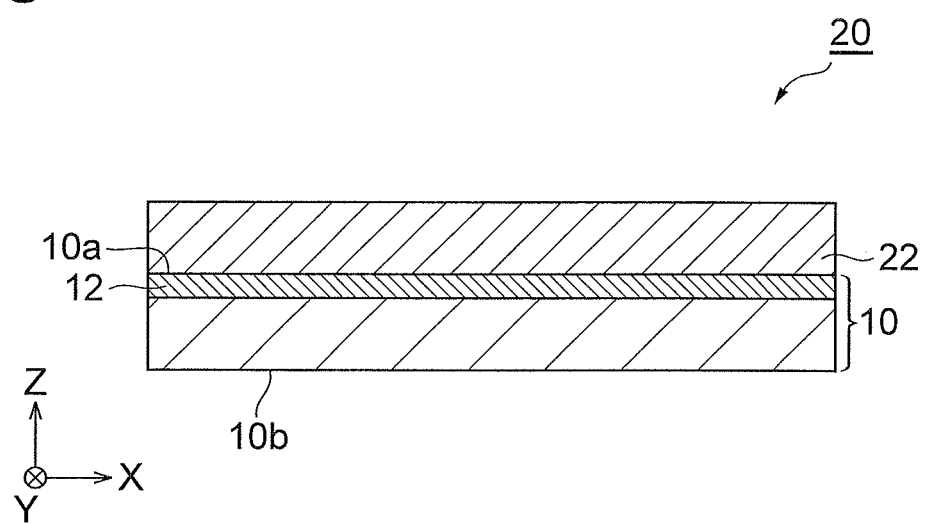
FIG. 4 is a schematic cross-sectional view illustrating an epitaxial substrate according to a first embodiment.

FIG. 4 is a schematic cross-sectional view illustrating an epitaxial substrate 20 according to a first embodiment. As illustrated in FIG. 4, the epitaxial substrate 20 comprises the above-described nitride substrate 10 serving as a base substrate, and an epitaxial layer 22 laminated on the front surface 10a of the nitride substrate 10.

The epitaxial layer 22 contains, for example, a group III nitride semiconductor. The group III nitride semiconductor is preferably a crystal having a wurtzite structure, examples include GaN, AlN, InN, AlGaN and InGaN. The epitaxial layer 22 can be formed by a vapor-phase growth method, such as an HVPE method, an MOCVD method, a VOC method, an MBE method or a sublimation method. By providing the epitaxial layer 22 on the nitride substrate 10, it is possible to improve the emission intensity of a semiconductor device.

Figure 5:
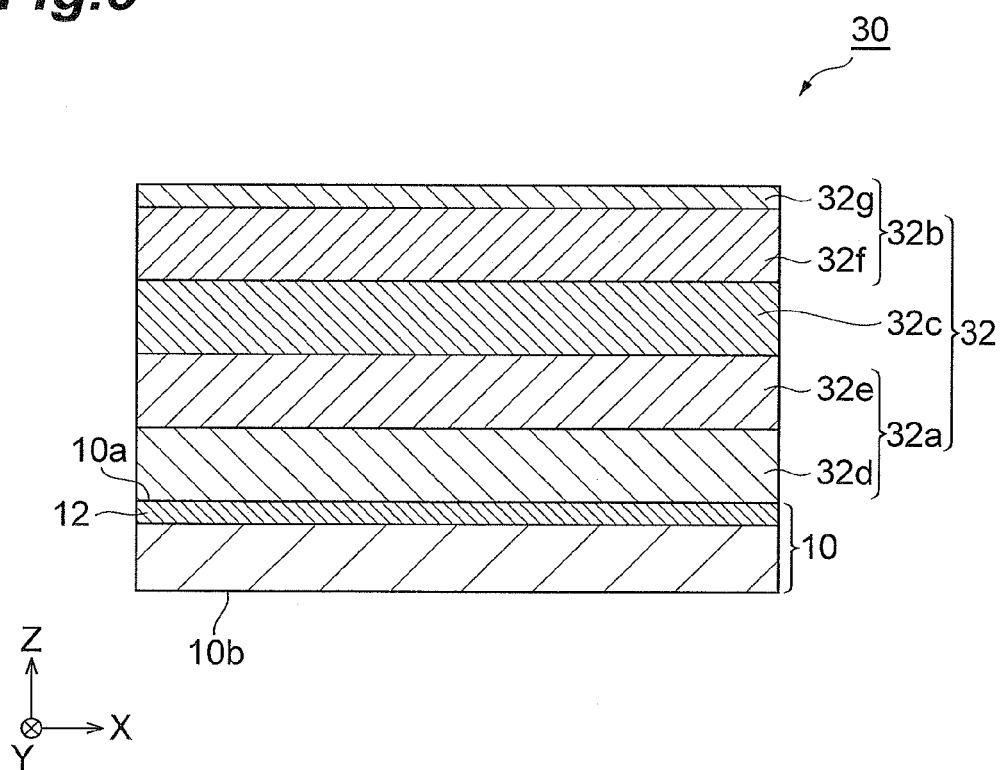
FIG. 5 is a schematic cross-sectional view illustrating an epitaxial substrate according to a second embodiment.

FIG. 5 is a schematic cross-sectional view illustrating an epitaxial substrate 30 according to a second embodiment. As illustrated in FIG. 5, in the epitaxial substrate 30, an epitaxial layer 32 composed of a plurality of layers is formed on the front surface 10a of the nitride substrate 10. By providing the epitaxial layer 32 on the nitride substrate 10, it is possible to improve the emission intensity of a semiconductor device.

The epitaxial layer 32 comprises a first semiconductor region 32a, a second semiconductor region 32b, and an active layer 32c provided between the first semiconductor region 32a and the second semiconductor region 32b. The first semiconductor region 32a includes one or a plurality of n-type semiconductor layers and has, for example, a 1 μm-thick n-type GaN layer 32d and a 150 nm-thick n-type Al$_{0.1}$Ga$_{0.9}$N layer 32e. The second semiconductor region 32b includes one or a plurality of p-type semiconductor layers and has, for example, a 20 nm-thick p-type Al$_{0.2}$Ga$_{0.8}$N layer 32f and a 150 nm-thick p-type GaN layer 32g. In the epitaxial layer 32, an n-type GaN layer 32d, an n-type Al$_{0.1}$Ga$_{0.9}$N layer 32e, an active layer 32c, a p-type Al$_{0.2}$Ga$_{0.8}$N layer 32f, and a p-type GaN layer 32g are laminated in this order on the nitride substrate 10.

The active layer 32c is provided so as to emit light having a wavelength of, for example, 430 nm to 550 nm. The active layer 32c includes, for example, a four-layered barrier layer and a three-layered well layer, and has a multiquantum well structure (MQW) formed by laminating barrier layers and well layers alternately. Each barrier layer is, for example, a 10 nm-thick GaN layer. Each well layer is, for example, a 3 nm-thick Ga$_{0.85}$In$_{0.15}$N layer.

The epitaxial layer 32 can be formed by epitaxially growing the n-type GaN layer 32d, the n-type Al$_{0.1}$Ga$_{0.9}$N layer 32e, the active layer 32c, the p-type Al$_{0.2}$Ga$_{0.8}$N layer 32f and the p-type GaN layer 32g in sequence on the nitride substrate 10 with, for example, an MOCVD (metal-organic chemical vapor deposition) method.

Figure 6:
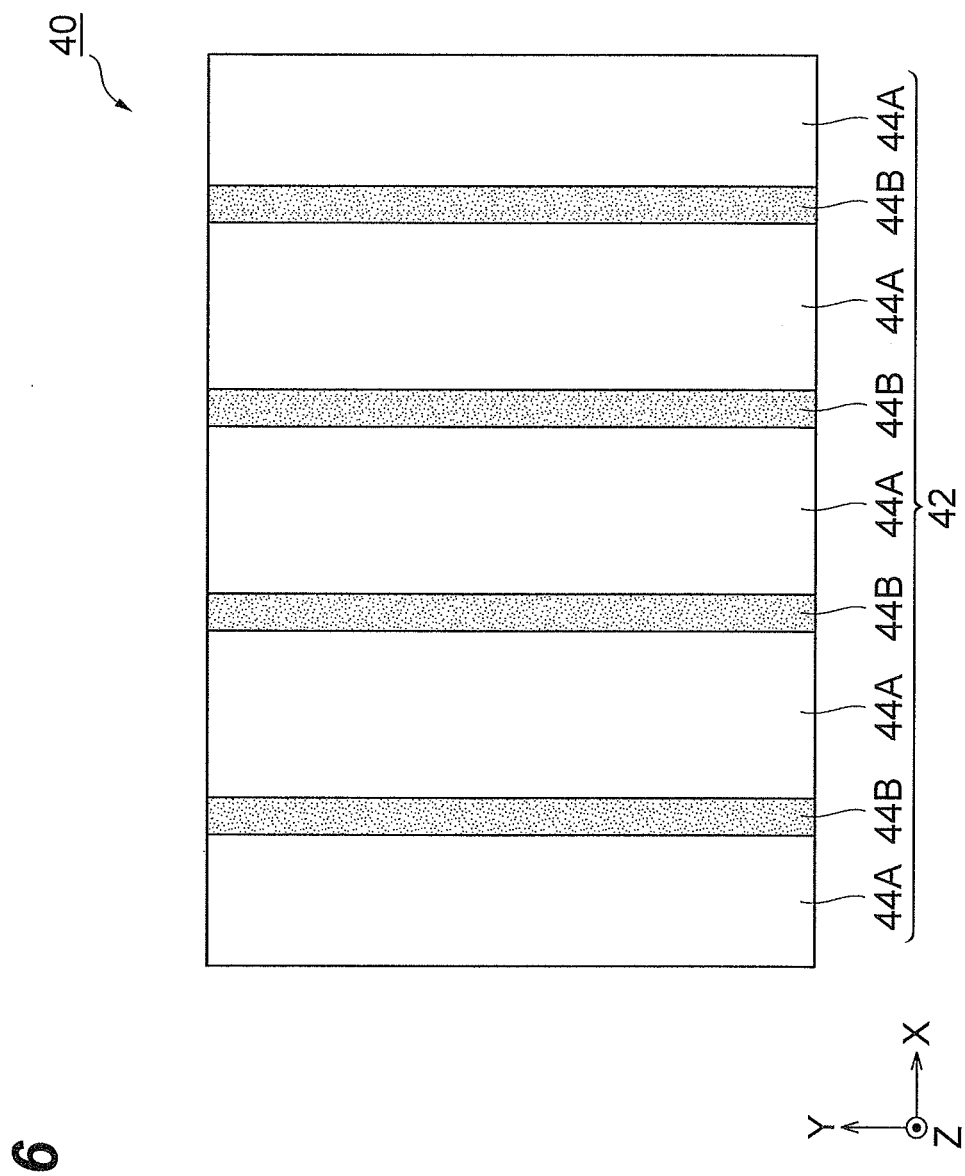
FIG. 6 is a plan view illustrating an epitaxial substrate according to a third embodiment.

FIG. 6 is a plan view illustrating an epitaxial substrate 40 according to a third embodiment. As illustrated in FIG. 6, the epitaxial substrate 40 comprises an epitaxial layer 42 disposed on the front surface 10a of the nitride substrate 10.

The epitaxial layer 42 includes a plurality of low-dislocation density regions 44A having a dislocation density lower than a predetermined dislocation density, and a plurality of high-dislocation density regions 44B having a dislocation density higher than the predetermined dislocation density. This predetermined dislocation density is, for example, $8 \times 10^7$ cm$^{-2}$.

Each low-dislocation density region 44A and each high-dislocation density region 44B extend in a striped manner, substantially in parallel with each other, in a plane direction (Y direction in FIG. 6) of the front surface 10a of the nitride substrate 10, and the regions 44A and 44B are formed from the rear surface to the font surface of the epitaxial layer 42. The epitaxial layer 42 has a stripe structure in which the low-dislocation density regions 44A and the high-dislocation density regions 44B are alternately arranged. The epitaxial layer 42 is composed of, for example, GaN, and the intracrystalline dislocation density is reduced due to the above-described stripe structure. The low-dislocation density regions 44A and the high-dislocation density regions 44B can be verified by making a CL observation using a scanning electron microscope (for example, S-4300 made by Hitachi Ltd.).

Next, a method for manufacturing an epitaxial substrate 40 will be described using FIG. 7. First, as illustrated in FIG. 7(a), stripe-shaped mask layers 46 are pattern-formed on a front surface 10a of a nitride substrate 10 serving as a base substrate, so as to extend, for example, in a Y direction shown in FIG. 7(a). Each mask layer 46 is form of, for example, SiO$_2$.

Next, as illustrated in FIG. 7(b), an epitaxial layer 42 is facet-grown by a vapor-phase growth method on the front surface 10a on which the above-described mask layers 46 are formed. As the vapor-phase growth method, it is possible to use an HVPE method, an MOCVD method, a VOC method, an MBE method, a sublimation method, or the like. As the epitaxial layer 42 is thick film-grown by means of facet growth, the mask layers 46 become covered with the epitaxial layer 42, and high-dislocation density regions 44B are formed in parts positioned on the mask layers 46.

The high-dislocation density regions 44B are not limited to the above-described stripe structure alone, alternatively, the regions 44B may have a square structure in which stripe-shaped high-dislocation density regions 44B are perpendicular to one another, as illustrated in FIG. 8(a), yet alternatively, the regions 44B may have a dot structure in which dot-shaped high-dislocation density regions 44B are regularly arranged at predetermined intervals thereamong, as illustrated in FIG. 8(b). High-dislocation density regions 44B having such a square structure or a dot structure can be obtained by the pattern formation of the epitaxial layer 42 using the mask layers 46, as in the case of the stripe structure.
(Semiconductor Device)

Figure 9:
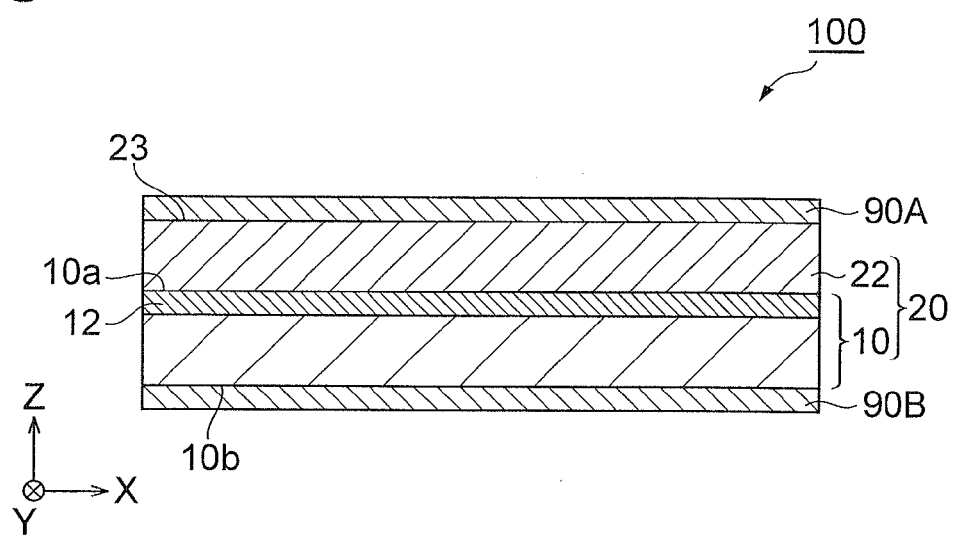
FIG. 9 is a schematic cross-sectional view illustrating a semiconductor device according to a first embodiment.

FIG. 9 is a schematic cross-sectional view illustrating a semiconductor device 100 according to a first embodiment. As illustrated in FIG. 9, the semiconductor device 100 comprises an epitaxial substrate 20, an electrode 90A formed so as to cover the entire surface 23 of an epitaxial layer 22, an electrode 90B formed so as to cover the entire rear surface 10b of a nitride substrate 10. The electrodes 90A and 90B are formed by means of, for example, metal vapor deposition. The positions in which the electrodes 90A and 90B are formed may be changed as appropriate, according to need, as long as the electrode 90B is electrically connected to the nitride substrate 10 and the electrode 90A is electrically connected to the epitaxial layer 22.

Figure 10:
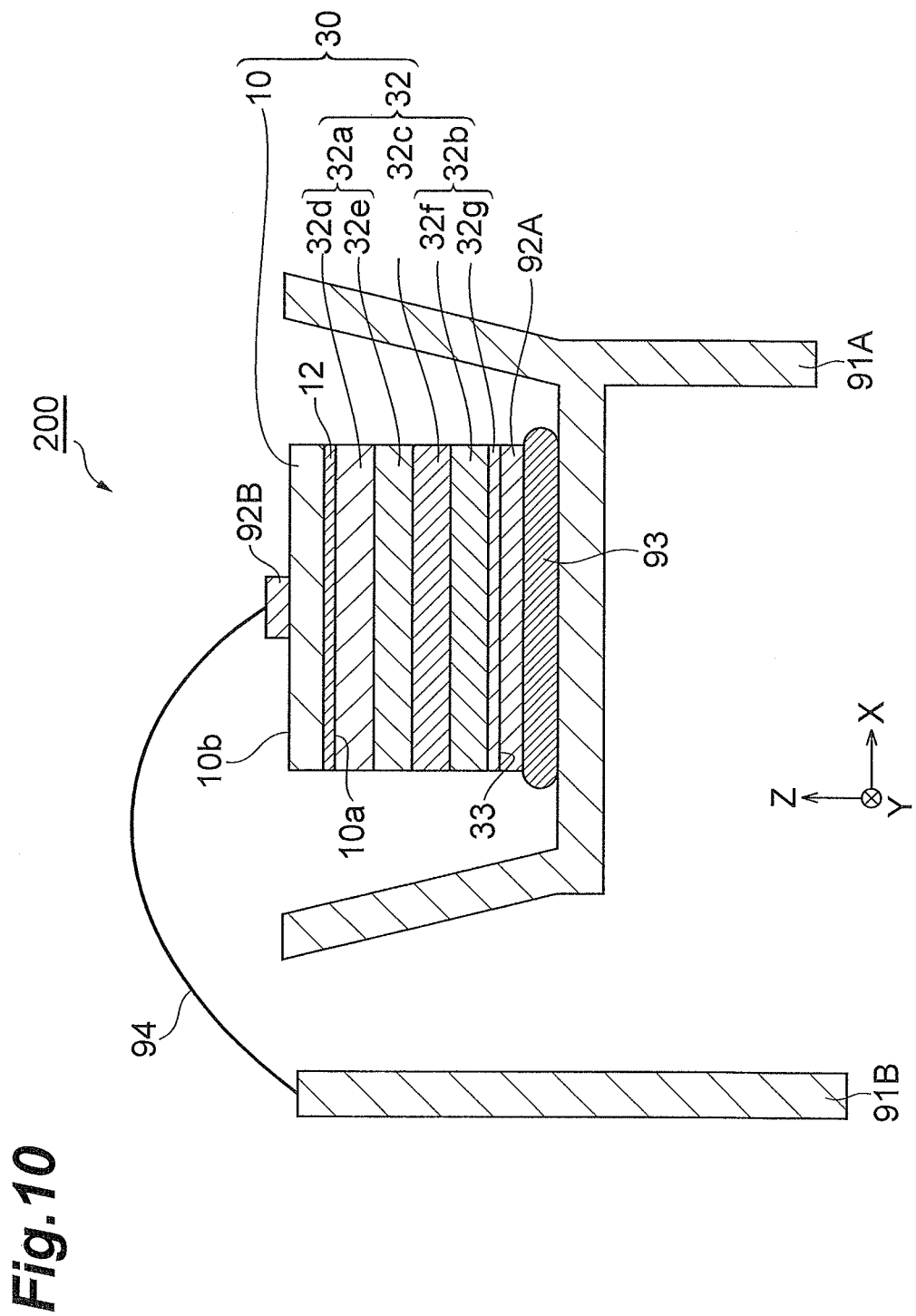
FIG. 10 is a schematic cross-sectional view illustrating a semiconductor device according to a second embodiment.

FIG. 10 is a schematic cross-sectional view illustrating a semiconductor device 200 according to a second embodiment. As illustrated in FIG. 10, the semiconductor device 200 comprises an epitaxial substrate 30, a first electrode (p-side electrode) 92A formed so as to cover the entire surface 33 of an epitaxial layer 32, and a second electrode (n-side electrode) 92B formed so as to cover part of the rear surface 10b of a nitride substrate 10. The size of the semiconductor device 200 is, for example, 400 μm-square or 2 mm-square. An electrical conductor 91A is electrically connected to the electrode 92A through a solder layer 93. An electrical conductor 91B is electrically connected to the electrode 92B through a wire 94.

The semiconductor device 200 can be manufactured according to the following procedure. First, the nitride substrate 10 is obtained by the above-described method. Next, an epitaxial layer 32 is laminated on the front surface 10a of the nitride substrate 10. In addition, the electrode 92A is formed on the surface 33 of the epitaxial layer 32, and the electrode 92B is formed on the rear surface 10b of the nitride substrate 10. Subsequently, the electrode 92A is electrically connected to the electrical conductor 91A by the solder layer 93, and the electrode 92B is electrically connected to the electrical conductor 91B by the wire 94.

Note that the present invention is not limited to the above-described embodiments. The plane orientations, such as the {20-21} plane, the M plane and the A plane, mentioned in the foregoing description are not only identified by their description itself, but include crystallographically equivalent planes and orientations. For example, the {20-21} plane includes not only the {20-21} plane itself, but also a (02-21) plane, a (0-221) plane, a (2-201) plane, a (-2021) plane and a (-2201) plane.

EXAMPLES

Hereinafter, the present invention will be described in detail according to examples, although the scope of the present invention is not limited to these examples.
(1) Fabrication of GaN Substrate First, an n-type GaN crystal (dopant: O) was grown in a c-axis direction by an HYPE method. Next, the GaN crystal was sliced vertically or parallel to a c-axis, to obtain GaN substrates of 50 mm (diameter)×0.5 mm (thickness), respectively. In addition, the GaN crystal was sliced with the crystal inclined from the c-axis toward an m-axis direction or from the c-axis toward an a-axis direction, to obtain GaN substrates of 50 mm (diameter)×0.5 mm (thickness), respectively.

Subsequently, dry etching was performed on a front surface of each GaN substrate and on a rear surface opposite to the front surface to remove affected layers. For the dry etching, an RIE apparatus having the same configuration as that shown in FIG. 2 was used. The volume (V) of a vacuum chamber was 20 L. The material of a substrate support base was SiC. $Cl_2$ and $CH_4$ were used as etching gases, and a gas flow rate (Q) was 30 sccm. The dry etching was performed at a pressure (P) of 4.0 Pa and a power of 50 W to 200 W (PV/Q=2.67).
(2) Lapping of GaN Substrate Surface The rear surface of each GaN substrate was bonded to a ceramic crystal holder with wax. A surface plate 380 mm in diameter was mounted on a lapping apparatus, and then, the surface plate was rotated around the rotational axis thereof, while feeding slurry including diamond abrasive grains dispersed from a slurry supply port to the surface plate. Next, a surface of n-type GaN crystal was lapped by rotating the GaN substrate around the rotational axis of the crystal holder, while pressing the GaN substrate against the surface plate by placing a weight on the crystal holder.

Lapping was performed under the following conditions. As the surface plate, a copper surface plate and a tin surface plate were used. Three types of diamond abrasive grains having grain diameters of 9 μm, 3 μm and 2 μm were prepared as the abrasive grains, and then, in the course of lapping, abrasive grains smaller in grain diameter were used in a stepwise manner. Polishing pressure was 100 g/cm$^2$ to 500 g/cm$^2$, and the rotational frequency of both the GaN substrate and the surface plate was 30 revolutions/min to 60 revolutions/min. As the result of lapping described above, it was confirmed that a surface of the GaN crystal substrate turned into a mirror surface.
(3) CMP of GaN Substrate Surface Using a polishing apparatus having the same configuration as that shown in FIG. 3, CMP was performed on a surface of each GaN substrate. CMP was performed under the following conditions. As a polishing pad, a polyurethane suede pad (Supreme RN-R made by Nitta Haas Inc.) was used. As a surface plate, a circular stainless-steel surface plate 380 mm in diameter was used. A contact coefficient C between the GaN substrate and the polishing pad was $1.0 \times 10^{-6}$ m to $2.0 \times 10^{-6}$ m. Polishing pressure was 10 kPa to 80 kPa, and the rotational frequency of both the GaN substrate and the polishing pad was 30 revolutions/min to 120 revolutions/min. For slurry (CMP solution), 20 mass % of silica grains 200 nm in grain diameter was dispersed in water as abrasive grains. Citric acid and $H_2SO_4$ were added to the slurry as pH adjusters, and sodium dichloroisocyanurate was added to the slurry as an oxidizing agent, in order to adjust the pH and the oxidation-reduction potential of the slurry to a range given by Expression (3) shown below (x: pH, y: oxidation-reduction potential (mV)).

$$-50x+1400 \leq y \leq -50x+1900 \tag{3}$$

GaN substrates different in surface composition were fabricated by changing the conditions of dry etching and CMP as appropriate. The sulfide content of a surface of each GaN substrate was evaluated by TXRF, and the oxide content was evaluated by AES. For TXRF, a W-sealed X-ray tube was used as a source of X rays, and measurements were made at an X-ray output voltage of 40 kV, an X-ray output current of 40 mA, and an incident angle of 0.05°. For AES, measurements were made at an acceleration voltage of 10 keV. Tables 1 to 5 show the plane orientations and surface compositions of GaN substrate surfaces.

(4) Fabrication of Laser Diode Including GaN Substrate

Figure 11:
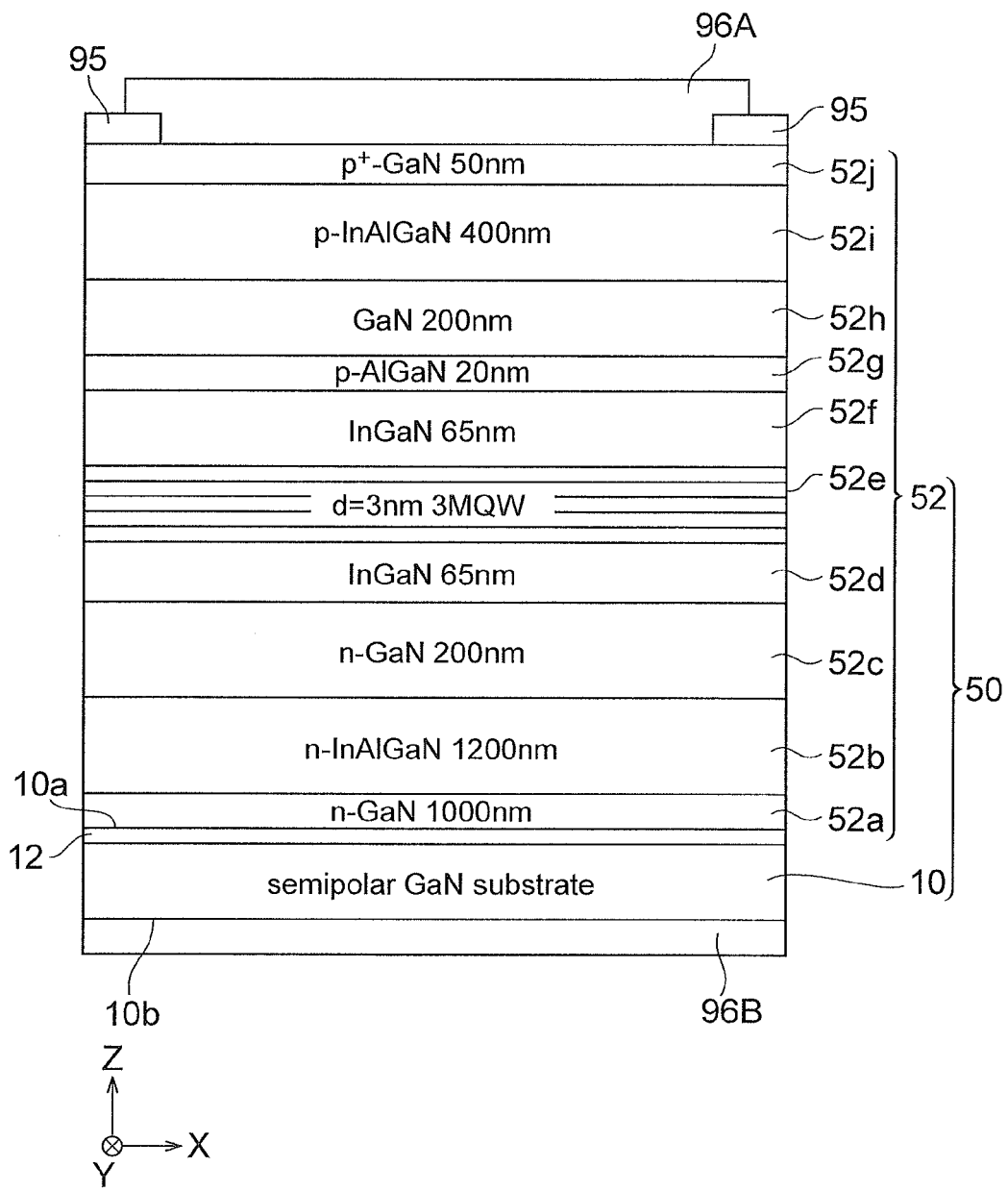
FIG. 11 is a schematic cross-sectional view illustrating a semiconductor device used in the examples.

A laser diode having a configuration illustrated in FIG. 11 was fabricated according to the following procedure. First, a GaN substrate 10 was mounted on a susceptor inside an MOCVD furnace. Then, an epitaxial layer 52 was formed on a front surface 10a, to obtain an epitaxial substrate 50.

The epitaxial layer 52 was fabricated by an MOCVD method according to the following growth procedure. First, a 1000 nm-thick n-type GaN layer 52a was grown on the GaN substrate 10. Next, a 1200 nm-thick n-type InAlGaN clad layer 52b was grown. Subsequently, after a 200 nm-thick n-type GaN guide layer 52c and a 65 nm-thick undoped InGaN guide layer 52d were grown, a 3-period MQW (active layer) 52e composed of 15 nm-thick GaN/3 nm-thick InGaN was grown. Subsequently, a 65 nm-thick undoped InGaN guide layer 52f, a 20 nm-thick p-type AlGaN block layer 52g, and a 200 nm-thick p-type GaN guide layer 52h were grown. Next, a 400 nm-thick p-type InAlGaN clad layer 52i was grown. Finally, a 50 nm-thick p-type GaN contact layer 52j was grown. Note that trimethyl gallium (TMGa), trimethyl aluminum (TMAl), trimethyl indium (TMIn), ammonia ($NH_3$), silane ($SiH_4$), and cyclopentadienyl magnesium ($Cp_2Mg$) were used as raw materials for fabricating the epitaxial layer 52.

After an insulating film 95 made of $SiO_2$ was formed on the contact layer 52j, a 10 μm-wide stripe window was formed by wet etching using photolithography. A laser stripe was provided, so as to be parallel with a direction in which a c-axis was projected to a substrate surface.

After the stripe window was formed, a p-side electrode 96A made of Ni/Au and a pad electrode made of Ti/Al were vapor-deposited. Subsequently, a rear surface 10b of the GaN substrate 10 was polished using diamond slurry, to fabricate a substrate product having the rear surface 10b being in a state of a mirror surface (mirror). At this time, the thickness of the substrate product was measured using a contact film thickness meter. Note that the thickness measurement may be made by microscopic observation of a sample's cross section. For a microscope, an optical microscope or a scanning electron microscope can be used. In addition, an n-side electrode 96B made of Ti/Al/Ti/Au was formed on the rear surface (polished surface) 10b of the GaN substrate 10 by means of vapor deposition.

In the fabrication of a resonator mirror for the laser stripe, a laser scriber using a YAG laser having a wavelength of 355 nm was used. If breaking is performed using the laser scriber, it is possible to improve the yield of oscillation chips, compared with breaking using a diamond scriber. Scribe grooves were formed under the following conditions: laser light output=100 mW; scanning rate=5 mm/s. The scribe grooves were 30 μm-long, 10 μm-wide, 40 μm-deep grooves. The scribe grooves were formed by directly irradiating laser light at 800 μm pitches to a surface of the epitaxial layer through openings in the insulating film of the substrate. A resonator length was 600 μm.

Using a blade, a resonant mirror was fabricated by means of cutting. A laser bar was fabricated by means of breaking by applying a pressing force to the backside of the substrate. A dielectric multilayer film was coated on an edge face of the laser bar by a vacuum deposition method. The dielectric multilayer film was structured by alternately laminating $SiO_2$ and $TiO_2$. The film thicknesses were respectively adjusted to within the range of 50 to 100 nm to work out a design so that the center wavelength of reflectance fell within the range of 500 to 530 nm. It was designed so that a reflecting surface on one side was set to 10 periods and the design value of reflectance was approximately 95%. A reflecting surface on the other side was set to 6 periods and the design value of reflectance was set to approximately 80%.

An LD thus obtained was evaluated at room temperature by applying current. For a power supply, a pulsed power supply having a pulse width of 500 ns and a duty ratio of 0.1% was used, and needles were placed onto the surface electrodes to apply current. A current density was set to $100A/cm^2$. An emission spectrum emitted from a front surface was measured by disposing an optical fiber on the front surface side of the laser bar at the time of observing LED mode light. Tables 1 to 5 show the integral intensities of LED mode light and half-value widths calculated from emission peaks in spectrum measurement. Note that Tables 1 to 3 show evaluation results of LDs using a GaN substrate obtained by slicing a GaN crystal inclined from a c-axis toward an m-axis direction. Tables 4, 5 show evaluation results of LDs using a GaN substrate obtained by slicing a GaN crystal inclined from a c-axis toward an a-axis direction. An emission spectrum emitted from an edge face was measured by disposing an optical fiber on the edge face side of the laser bar at the time of observing laser light. The emission wavelength of the LED mode light was 500 nm to 550 nm. The oscillation wavelength of the laser light was 500 nm to 530 nm.

TABLE 1

| m Direction | | Comparative Example | | | Example | | | | |
|---|---|---|---|---|---|---|---|---|---|
| | | 1-1 | 1-2 | 1-3 | 1-1 | 1-2 | 1-3 | 1-4 | 1-5 |
| Off angle | Degrees (°) | 0 | 0 | 10 | 10 | 17 | 25 | 43 | 51 |
| Plane orientation | — | 0001 | 0001 | 10-1 11 | 10-1 11 | 10-16 | 10-14 | 10-12 | 20-23 |
| S concentration | $10^{10}$ pieces/$cm^2$ | 100 | 100 | 100 | 100 | 100 | 100 | 100 | 100 |
| O concentration | at % | 1 | 3 | 1 | 3 | 3 | 8 | 10 | 14 |
| Integral intensity | a.u. | 2.1 | 5.1 | 5.2 | 10.0 | 12.8 | 14.2 | 15.1 | 15.4 |
| Half-value width | nm | — | 64 | 65 | 55 | 51 | 50 | 49 | 48 |

TABLE 2

| m Direction | | Example | | | | | Comparative Example | | |
|---|---|---|---|---|---|---|---|---|---|
| | | 1-6 | 1-7 | 1-8 | 1-9 | 1-10 | 1-4 | 1-5 | 1-6 |
| Off angle | Degrees (°) | 62 | 75 | 80 | 80 | 10 | 80 | 90 | 90 |
| Plane orientation | — | 10-11 | 20-21 | 30-31 | 30-31 | 10-1 11 | 30-31 | 10-10 | 10-10 |

TABLE 2-continued

|  | m Direction | Example | | | | | Comparative Example | | |
|---|---|---|---|---|---|---|---|---|---|
|  |  | 1-6 | 1-7 | 1-8 | 1-9 | 1-10 | 1-4 | 1-5 | 1-6 |
| S concentration | $10^{10}$ pieces/cm² | 100 | 100 | 100 | 100 | 100 | 100 | 100 | 100 |
| O concentration | at % | 16 | 16 | 16 | 3 | 16 | 24 | 16 | 24 |
| Integral intensity | a.u. | 18.6 | 20.2 | 15.5 | 14.8 | 10.5 | 4.5 | 5.2 | 0 |
| Half-value width | nm | 35 | 32 | 40 | 42 | 58 | 55 | 65 | — |

TABLE 3

|  | m Direction | Comparative Example | | | | Example | | | |
|---|---|---|---|---|---|---|---|---|---|
|  |  | 1-7 | 1-8 | 1-9 | 1-10 | 1-11 | 1-12 | 1-13 | 1-14 |
| Off angle | Degrees (°) | 17 | 17 | 17 | 17 | 17 | 17 | 17 | 17 |
| Plane orientation | — | 10-16 | 10-16 | 10-16 | 10-16 | 10-16 | 10-16 | 10-16 | 10-16 |
| S concentration | $10^{10}$ pieces/cm² | 20 | 3000 | 30 | 2000 | 30 | 30 | 2000 | 2000 |
| O concentration | at % | 2 | 20 | 1 | 24 | 2 | 20 | 2 | 20 |
| Integral intensity | a.u. | 5.5 | 5.6 | 5.4 | 5.3 | 10.2 | 9.5 | 9.7 | 9.8 |
| Half-value width | nm | 62 | 63 | 61 | 60 | 53 | 55 | 56 | 57 |

TABLE 4

|  | a Direction | Comparative Example | | | Example | | | | |
|---|---|---|---|---|---|---|---|---|---|
|  |  | 2-1 | 2-2 | 2-3 | 2-1 | 2-2 | 2-3 | 2-4 | 2-5 |
| Off angle | Degrees (°) | 0 | 0 | 10 | 10 | 18 | 25 | 39 | 58 |
| Plane orientation | — | 0001 | 0001 | 11-2 18 | 11-2 18 | 11-2 10 | 11-27 | 11-24 | 11-22 |
| S concentration | $10^{10}$ pieces/cm² | 120 | 120 | 120 | 120 | 120 | 120 | 120 | 120 |
| O concentration | at % | 1 | 3 | 1 | 3 | 3 | 8 | 10 | 14 |
| Integral intensity | a.u. | 2.2 | 5.2 | 5.3 | 10.5 | 12.5 | 14.3 | 15.0 | 18.1 |
| Half-value width | nm | — | 63 | 63 | 54 | 50 | 49 | 48 | 37 |

TABLE 5

|  | a Direction | Example | | | | | Comparative Example | | |
|---|---|---|---|---|---|---|---|---|---|
|  |  | 2-6 | 2-7 | 2-8 | 2-9 | 2-10 | 2-4 | 2-5 | 2-6 |
| Off angle | Degrees (°) | 65 | 73 | 81 | 81 | 10 | 81 | 90 | 90 |
| Plane orientation | — | 22-43 | 11-21 | 22-41 | 22-41 | 11-2 18 | 22-41 | 11-20 | 11-20 |
| S concentration | $10^{10}$ pieces/cm² | 120 | 120 | 120 | 120 | 120 | 120 | 120 | 120 |
| O concentration | at % | 16 | 16 | 16 | 3 | 16 | 24 | 16 | 24 |
| Integral intensity | a.u. | 18.8 | 19.5 | 15.2 | 14.9 | 10.3 | 4.4 | 5.3 | 0 |
| Half-value width | nm | 35 | 32 | 40 | 43 | 59 | 54 | 64 | — |

As shown in Tables 1 to 5, excellent emission intensities were obtained in Examples 1-1 to 1-14 and Examples 2-1 to 2-10, since S-equivalent sulfide contents were within the range of $30 \times 10^{10}$ pieces/cm² to $2000 \times 10^{10}$ pieces/cm² and O-equivalent oxide contents were within the range of 2 at % to 20 at %, with the normal axis of a surface having a specific inclination angle with respect to a c-axis. In addition, it was confirmed that if the plane orientation of the surface was one of a {20-21} plane, a {20-2-1} plane, a {10-11} plane, a {10-1-1} plane, a {11-22} plane, a {11-2-2} plane, a {22-43} plane, a {22-4-3} plane, a {11-21} plane, and a {11-2-1} plane, a half-value width calculated from emission peaks in spectrum measurement was small and a spread of emission wavelengths was narrow. In particular, high integral intensities and small half-value widths were obtained for the {20-21} plane, the {20-2-1} plane, the {11-21} plane, and the {11-2-1} plane.

On the other hand, it was confirmed that emission intensities decreased in Comparative Examples 1-1, 1-3, 1-4, 1-6, 2-1, 2-3, 2-4 and 2-6, since oxide contents were out of the abovementioned range. In Comparative Examples 1-2, 1-5, 2-2 and 2-5, it was confirmed that emission intensities decreased since the surface did not have the abovementioned specific plane orientation. In Comparative Examples 1-7 to 1-10, it was confirmed that emission intensities decreased since oxide or sulfide contents were out of the abovementioned ranges.

In addition, substrates same in plane orientation and oxide and sulfide contents as Example 1-5 but different in chloride, silicon compound, carbon compound and copper compound contents and in surface roughness and dislocation density were fabricated as Examples 1-15 and 1-16, and likewise evaluated with regard to laser characteristics. Example 1-15 was $5000\times10^{10}$ pieces/cm$^2$ in Cl concentration, $2000\times10^{10}$ pieces/cm$^2$ in Si concentration, 12 at % in carbon concentration, $50\times10^{10}$ pieces/cm$^2$ in copper concentration, 1.5 nm in surface roughness, and $1\times10^6$ pieces/cm$^2$ in dislocation density. Example 1-16 was $18000\times10^{10}$ pieces/cm$^2$ in Cl concentration, $15000\times10^{10}$ pieces/cm$^2$ in Si concentration, 25 at % in carbon concentration, $200\times10^{10}$ pieces/cm$^2$ in copper concentration, 6 nm in surface roughness, and $1\times10^7$ pieces/cm$^2$ in dislocation density. Example 1-15 was 17.3 in integral intensity and 47 nm in half-value width. Example 1-16 was 14.9 in integral intensity and 50 nm in half-value width. In Example 1-15, particularly excellent characteristics were obtained since oxide, sulfide, chloride, silicon compound, carbon compound and copper compound contents, surface roughness, and dislocation density were within the above-mentioned specific ranges.

REFERENCE SIGNS LIST

10: Nitride substrate (group III nitride semiconductor substrate), 10a: Front surface, 12: Surface layer, 20, 30, 40, 50: Epitaxial substrate, 22, 32, 42, 52: Epitaxial layer, 32c, 52e: Active layer, 100, 200: Semiconductor device.

The invention claimed is:

1. A group III nitride semiconductor substrate used in a semiconductor device, comprising a surface layer on a front surface of the group III nitride semiconductor substrate, wherein
    the surface layer has a surface concentration density of $30\times10^{10}$ pieces/cm$^2$ to $2000\times10^{10}$ pieces/cm$^2$ of sulfur and 2 at % to 20 at % of oxygen, and
    an inclination angle of a normal axis of the front surface with respect to a c-axis is 10° to 81°.

2. The group III nitride semiconductor substrate according to claim 1, wherein the surface layer has the surface concentration density of $40\times10^{10}$ pieces/cm$^2$ to $1500\times10^{10}$ pieces/cm$^2$ of sulfide.

3. The group III nitride semiconductor substrate according to claim 1, wherein the surface layer has the surface concentration density of 3 at % to 16 at % of oxygen.

4. The group III nitride semiconductor substrate according to claim 1, wherein the surface layer has a surface concentration density of $120\times10^{10}$ pieces/cm$^2$ to $15000\times10^{10}$ pieces/cm$^2$ chlorine.

5. The group III nitride semiconductor substrate according to claim 1, wherein the surface layer has a surface concentration density of $100\times10^{10}$ pieces/cm$^2$ to $12000\times10^{10}$ pieces/cm$^2$ silicon.

6. The group III nitride semiconductor substrate according to claim 1, wherein a content of carbon in a carbon compound in the surface layer is 22 at % or less.

7. The group III nitride semiconductor substrate according to claim 1, wherein a content of copper in a copper compound in the surface layer is $150\times10^{10}$ pieces/cm$^2$ or lower.

8. The group III nitride semiconductor substrate according to claim 1, wherein a surface roughness of the surface layer is 5 nm or less on an RMS basis.

9. The group III nitride semiconductor substrate according to claim 1, wherein a dislocation density of the surface layer is $1\times10^6$ pieces/cm$^2$ or lower.

10. The group III nitride semiconductor substrate according to claim 1, wherein a plane orientation of the front surface is one of a {20-21} plane, a {20-2-1} plane, a {10-11} plane, a {10-1-1} plane, a {11-22} plane, a {11-2-2} plane, a {22-43} plane, a {22-4-3} plane, a {11-21} plane and a {11-2-1} plane.

11. An epitaxial substrate, comprising the group III nitride semiconductor substrate according to claim 1 and an epitaxial layer formed on the surface layer of the group III nitride semiconductor substrate, wherein the epitaxial layer contains a group III nitride semiconductor.

12. The epitaxial substrate according to claim 11, wherein
    the epitaxial layer comprises an active layer having a quantum well structure and
    the active layer is provided so as to emit light of 430 nm to 550 nm in wavelength.

13. A semiconductor device comprising the epitaxial substrate according to claim 11.

14. A semiconductor device comprising the epitaxial substrate according to claim 12.

15. The group III nitride semiconductor substrate according to claim 1, wherein the inclination angle of the normal axis of the front surface with respect to the c-axis is 51° to 81°.

* * * * *